(12) United States Patent
Harrah et al.

(10) Patent No.: US 7,906,794 B2
(45) Date of Patent: Mar. 15, 2011

(54) LIGHT EMITTING DEVICE PACKAGE WITH FRAME AND OPTICALLY TRANSMISSIVE ELEMENT

(75) Inventors: Shane Harrah, Everett, WA (US); Ingo Speier, Saanichton (CA); Philippe Schick, Vancouver (CA)

(73) Assignee: Koninklijke Philips Electronics N.V., Eindhoven (NL)

( * ) Notice: Subject to any disclaimer, the term of this patent is extended or adjusted under 35 U.S.C. 154(b) by 277 days.

(21) Appl. No.: 11/773,426

(22) Filed: Jul. 4, 2007

(65) Prior Publication Data

US 2008/0054288 A1 Mar. 6, 2008

Related U.S. Application Data

(60) Provisional application No. 60/832,713, filed on Jul. 5, 2006.

(51) Int. Cl.
*H01L 33/00* (2010.01)
*H01L 21/02* (2010.01)

(52) U.S. Cl. ............ 257/99; 257/98; 257/100; 257/434; 257/E23.066; 257/E23.087

(58) Field of Classification Search .................... 257/98, 257/99, 100, 434, E23.066, E23.087
See application file for complete search history.

(56) References Cited

U.S. PATENT DOCUMENTS

| 5,077,587 | A | 12/1991 | Albergo |
| 5,355,942 | A | 10/1994 | Conte |
| 5,813,753 | A | 9/1998 | Vriens |
| 5,890,794 | A | 4/1999 | Abtahi |
| 6,204,523 | B1 | 3/2001 | Carey |
| 6,211,626 | B1 | 4/2001 | Lys |
| 6,345,903 | B1 | 2/2002 | Koike |
| 6,480,389 | B1 | 11/2002 | Shie |
| 6,483,705 | B2 | 11/2002 | Snyder |
| 6,498,355 | B1 | 12/2002 | Harrah |
| 6,507,159 | B2 | 1/2003 | Muthu |
| 6,510,995 | B2 | 1/2003 | Muthu |
| 6,590,235 | B2 | 7/2003 | Carey |

(Continued)

FOREIGN PATENT DOCUMENTS

EP 0529837 A1 3/1993

(Continued)

OTHER PUBLICATIONS

Kim, et al., Light Extraction in GaInN Light-Emitting Diodes using Diffuse Omnidirectional Reflectors. Journal of the Electrochemical Society, 153(2): G105-G107 (2006).

(Continued)

*Primary Examiner* — Hung Vu
*Assistant Examiner* — Vernon P Webb

(57) ABSTRACT

The present invention provides a lighting device package with one or more light-emitting elements operatively coupled to a substrate and a frame disposed at least in part around the one or more light-emitting elements. The frame and substrate define a cavity in which the one or more light-emitting elements are positioned, wherein this cavity can be substantially enclosed by an optically transmissive system. At least a portion of the cavity can be filled with an encapsulation material. The frame defines one or more passageways, wherein each passageway interconnects the cavity with the outside through an outside port. For example, the outside port can be accessible from the ambient when the lighting device package is in an assembled state, thereby enabling fluidic movement of the encapsulation material into and/or out of the cavity.

20 Claims, 3 Drawing Sheets

U.S. PATENT DOCUMENTS

| | | |
|---|---|---|
| 6,610,563 B1 | 8/2003 | Waitl |
| 6,610,598 B2 | 8/2003 | Chen |
| 6,617,795 B2 | 9/2003 | Bruning |
| 6,630,801 B2 | 10/2003 | Schuurmans |
| 6,639,360 B2 | 10/2003 | Roberts |
| 6,659,578 B2 | 12/2003 | Gudaitis |
| 6,679,315 B2 | 1/2004 | Cosley |
| 6,707,069 B2 | 3/2004 | Song |
| 6,717,362 B1 | 4/2004 | Lee |
| 6,741,351 B2 | 5/2004 | Marshall |
| 6,858,870 B2 | 2/2005 | Lee |
| 6,860,621 B2 | 3/2005 | Bachl |
| 6,867,929 B2 | 3/2005 | Lopez-Hernandez |
| 6,897,486 B2 | 5/2005 | Loh |
| 6,903,380 B2 | 6/2005 | Barnett |
| 6,921,929 B2 | 7/2005 | LeBoeuf |
| 6,924,514 B2 | 8/2005 | Suenaga |
| 6,933,535 B2 | 8/2005 | Steigerwald |
| 6,940,704 B2 | 9/2005 | Stalions |
| 6,946,714 B2 | 9/2005 | Waitl |
| 6,949,771 B2 | 9/2005 | Yoganandan |
| 6,976,769 B2 | 12/2005 | McCullough |
| 6,982,522 B2 | 1/2006 | Omoto |
| 6,991,356 B2 | 1/2006 | Tsimerman |
| 6,995,402 B2 | 2/2006 | Ludowise |
| 7,015,516 B2 | 3/2006 | Eliashevich |
| 7,023,022 B2 | 4/2006 | Eliashevich |
| 7,026,657 B2 | 4/2006 | Bogner |
| 7,045,905 B2 | 5/2006 | Nakashima |
| 7,105,858 B2 | 9/2006 | Popovich |
| 2001/0048064 A1* | 12/2001 | Kitani ........................ 250/208.1 |
| 2003/0030808 A1 | 2/2003 | Marshall |
| 2003/0201451 A1 | 10/2003 | Suehiro |
| 2004/0041222 A1 | 3/2004 | Loh |
| 2004/0079957 A1 | 4/2004 | Andrews |
| 2004/0131096 A1 | 7/2004 | Lee |
| 2004/0169451 A1 | 9/2004 | Oishi |
| 2004/0169466 A1 | 9/2004 | Suehiro |
| 2004/0222433 A1 | 11/2004 | Mazzochette |
| 2005/0012108 A1 | 1/2005 | Lin |
| 2005/0045904 A1 | 3/2005 | Chen |
| 2005/0139846 A1 | 6/2005 | Park |
| 2005/0194607 A1* | 9/2005 | Barnett et al. ................. 257/99 |
| 2005/0199884 A1 | 9/2005 | Lee |
| 2005/0221519 A1 | 10/2005 | Leung |
| 2005/0231983 A1 | 10/2005 | Dahm |
| 2005/0269587 A1 | 12/2005 | Loh |
| 2006/0017127 A1 | 1/2006 | Vigier-Blanc |
| 2006/0022214 A1 | 2/2006 | Morgan |
| 2006/0083000 A1 | 4/2006 | Yoon |
| 2006/0105485 A1 | 5/2006 | Basin |
| 2006/0261470 A1 | 11/2006 | Schick |

FOREIGN PATENT DOCUMENTS

| | | |
|---|---|---|
| EP | 1367640 A1 | 12/2003 |
| EP | 1416219 A1 | 5/2004 |
| EP | 1453107 A1 | 9/2004 |
| GB | 2343548 A | 5/2000 |
| JP | 11214741 A | 8/1999 |
| WO | WO9103085 A1 | 3/1991 |
| WO | WO02081996 A2 | 10/2002 |
| WO | WO03010830 A2 | 2/2003 |
| WO | WO2004023522 A2 | 3/2004 |
| WO | WO2004100343 A2 | 11/2004 |
| WO | WO2005067063 A1 | 7/2005 |
| WO | WO2005107420 A2 | 11/2005 |
| WO | WO2006021837 A1 | 3/2006 |
| WO | WO2006065558 A2 | 6/2006 |

OTHER PUBLICATIONS

U.S. Appl. No. 10/582,565, filed Jun. 12, 2006, Speier, et al.

* cited by examiner

LIGHT EMITTING DEVICE PACKAGE WITH FRAME AND OPTICALLY TRANSMISSIVE ELEMENT

FIELD OF THE INVENTION

The present invention pertains to lighting and in particular to the design of lighting device packages.

BACKGROUND

Light-emitting diodes (LEDs) can be more effective if an LED package is adequately designed to effectively extract the light which is generated inside the LED under operating conditions. From the perspective of a device designer, effective light extraction can be a matter of improving the chances that light from the LED dies is effectively guided so it can leave the LED package in the desired direction. A number of design features can influence the optical paths such as the orientation and the position of reflective interfaces and whether the type of reflection has a specular or diffuse nature. Moreover, refractive properties of an LED package can affect the efficiency of the light extraction. A number of publications describe how to design LED packages including factors such as structure and composition, for example.

PCT Application Publication No. WO 2005/067063 describes an arrangement comprising a substrate with a plurality of electrically conductive traces and at least one light emitting device surface mounted on the substrate and connected with a first and a second electrical electrode to the electrically conductive traces. A ring that is placed onto the substrate surrounding the light emitting device and comprises a lower surface that is attached to the substrate and an upper surface that is designed to reflect the light emitted by the light emitting device in a desired direction. This ring enables the collection and redirection of light and can allow precise placement of an encapsulation or a lens that may be part of the encapsulation and absorbs thermal energy from the encapsulation that has been transferred from the top and sidewalls of the light emitting device.

U.S. Pat. No. 6,940,704 describes a light-emitting diode comprising a surface mount package having a metal lead frame having mass sufficient to provide low thermal resistance, at least one anode contact pad and at least one cathode contact pad. The LED also includes a reflector positioned within the package, a semiconductor die and an optional focusing dome. The semiconductor die comprises a transparent substrate and a semiconductor component and is positioned within the package so that the semiconductor component and the substrate are arranged side-by-side over the reflector or the die is positioned within the package so that the substrate is on top of the semiconductor component.

U.S. Pat. No. 6,982,522 describes a LED device comprising a base having a recess with the upper surface opened, the inner wall surface of the recess constituting a reflection surface; a LED chip disposed on the inner bottom of the recess; a resin filled in the recess, the resin including phosphors which absorb a part of the light emitted from the LED chip to convert and emit light; and a phosphor layer formed on the reflection surface, the phosphor layer including the phosphors.

U.S. Pat. No. 6,949,771 describes light source including a planar substrate with a centrally positioned aperture. A light emitting diode is mounted on a metallic layer covering the bottom of the aperture and is encapsulated by a transparent encapsulation material. The metallic layer provides a thermal path for heat generated by the light emitting diode.

U.S. Pat. Nos. 6,590,235 and 6,204,523 describe a LED component with light emission in the green-to-near UV wavelength range. The light-emitting semiconductor die is encapsulated with one or more silicone compounds, including a hard outer shell, an interior gel or resilient layer, or both. The silicone material is stable over temperature and humidity ranges, and over exposure to ambient UV radiation.

U.S. Pat. No. 6,995,402 describes a mount for a semiconductor light emitting device which includes an integrated reflector cup. The reflector cup includes a wall formed on the mount which is shaped and positioned to reflect side light emitted from the light emitting device along a vertical axis of the device/mount combination.

U.S. Pat. No. 6,897,486 describes a light-emitting die package and a method of making it. The die package includes a stem substrate having grooves, a wire lead attached to the grooves, and a LED mounted on the stem substrate. Coupled to the substrate are a sleeve, a reflector, and a lens. To make the light-emitting die package, a long substrate is formed and wire leads are attached to the substrate. The substrate including the attached wire leads is cut to predetermined lengths to form individual stem substrates. To each stem substrate, LED, reflector, and lens are coupled.

U.S. Pat. No. 6,610,563 describes a method for producing a surface mounting optoelectronic component comprising the following steps: readying a base body with the optoelectronic transmitter and/or receiver arranged in a recess of the base body, filling the recess of the base body with a transparent, curable casting compound, and placing the optical device onto the base body, so whereby the optical device comes into contact with the casting compound.

United States Patent Application Publication No. 2005/0221519 describes methods of packaging a semiconductor light emitting device which include dispensing a first quantity of encapsulation material into a cavity including the light emitting device. The first quantity of encapsulation material in the cavity is treated to form a hardened upper surface having a selected shape. A luminescent conversion element is provided on the upper surface of the treated first quantity of encapsulation material. The luminescent conversion element includes a wavelength conversion material and has a thickness at a middle region of the cavity greater than proximate a sidewall of the cavity.

United States Patent Application Publication No. 2005/0269587 describes a light-emitting die package and a method of manufacture. The die package includes a lead frame, at least one LED, a moulded body, and a lens. The lead frame includes a plurality of leads and has a top side and a bottom side. A portion of the lead frame defines a mounting pad. The LED device is mounted on the mounting pad. The moulded body is integrated with portions of the lead frame and defines an opening on the top side of the lead frame, the opening surrounding the mounting pad. The moulded body further includes latches on the bottom side of the lead frame. The lens is coupled to the moulded body. A composite lens is used as both reflector and imaging tool to collect and direct light emitted by LED(s) for desired spectral and luminous performance.

United States Patent Application Publication No. 2005/0199884 describes a high-power LED package, in which substantially planar first and second lead frames made of high reflectivity metal are spaced from each other for a predetermined gap. An LED chip is seated on at least one of the lead frames and has terminals electrically connected to the lead frames. A package body made of resin seals the LED chip while fixedly securing the lead frame in its bottom. An encapsulation material fills up the gap between the first and second lead frames.

United States Patent Application Publication No. 2005/0045904 describes a light emitting diode with high heat dissipation which includes a printed circuit board, a conductive material, a LED chip, and a compound resin. The printed circuit board has an upper surface and a lower surface opposite to the upper surface. A via hole penetrated from the upper surface to the lower of the printed circuit board. The upper surface of the printed circuit board is formed with electrodes. The conductive material is filled into the via hole of the printed circuit board. The LED chip is mounted on the upper surface of the printed circuit board and contacts the conductive material. The compound resin encapsulates the LED chip.

United States Patent Application Publication No. 2004/0041222 describes a light-emitting die package which includes a substrate, a reflector plate, and a lens. The substrate is made from thermally conductive but electrically insulating material. The substrate has traces for connecting an external electrical power source to a LED at a mounting pad. The reflector plate is coupled to the substrate and substantially surrounds the mounting pad. The lens is free to move relative to the reflector plate and is capable of being raised or lowered by the encapsulation material that wets and adheres to it and is placed at an optimal distance from the LED chip(s). The lens can be coated with any optical system of chemical that affects the performance of the device.

European Patent No. 1,453,107 describes a LED light comprising a light-emitting device provided to power supply means, encapsulating means for encapsulating the light-emitting device with a light-transmitting material, a reflective surface for reflecting the light emitted from the light-emitting device to a direction perpendicular to the center axis of the light-emitting device or at a large angle to the center axis, opposed to the light-emitting surface of the light-emitting device, a light-emitting diode having a side directing surface for directing sideways the light reflected from the reflective surface to a direction perpendicular to the center axis of the light-emitting device or at a large angle to the center axis, and a reflecting mirror disposed around the light-emitting diode.

Today's typical LED packages require many components with complex mechanical setup or difficult manufacturing in order to realize an accurately performing optical setup. In addition, the LEDs of a package are typically encapsulated with an encapsulation material prior to the mounting of an optical lens which encloses the LEDs. This configuration may result in an undesired amount of encapsulation material being used, for example too much or too little and may result in an impairment of the optical efficiency of the LED package. Therefore there is a need for a new lighting device package.

This background information is provided to reveal information believed by the applicant to be of possible relevance to the present invention. No admission is necessarily intended, nor should be construed, that any of the preceding information constitutes prior art against the present invention.

SUMMARY OF THE INVENTION

An object of the present invention is to provide a lighting device package. In accordance with an aspect of the present invention, there is provided a lighting device package comprising: a substrate; a frame disposed on the substrate and defining a cavity, the frame comprising one or more passageways defined therein, each of said one or more passageways fluidically coupling the cavity to an associated outside port; one or more light-emitting elements operatively disposed within the cavity; and an optically transmissive system disposed on the frame and optically coupled to the one or more light-emitting elements; wherein the cavity is at least in part filled with a light transmissive encapsulation material and wherein said one or more passageways enable fluidic movement of the encapsulation material.

In accordance with another aspect of the present invention, there is provided a method of fabricating a lighting device package comprising the steps of: providing a substrate; coupling a frame to the substrate thereby defining a cavity and the frame defining two or more passageways fluidically coupling the cavity to an associated outside port; operatively coupling one or more light-emitting elements to the substrate, wherein said one or more light-emitting elements are disposed within the cavity; coupling an optically transmissive system to the frame; and inserting a desired amount of encapsulation material into the cavity through the outside port and via one or more of the two or more passageways, wherein one of the one or more passageways provides for gas escape from the cavity.

DETAILED DESCRIPTION OF THE INVENTION

Definitions

Figure 1:
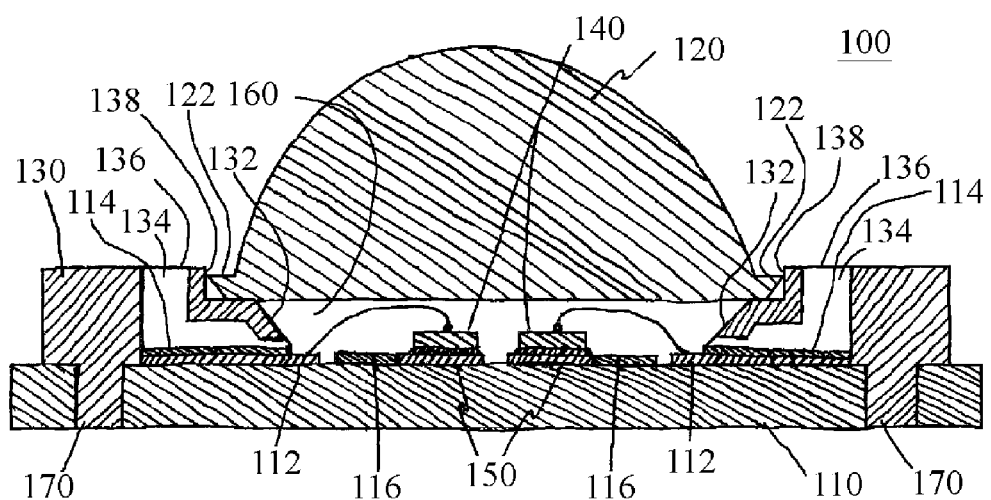
FIG. 1 schematically illustrates a cross section of a lighting device package according to one embodiment of the present invention.

The term "light-emitting element" is used to refer to a device that comprises an element which emits radiation in a wavelength region or combination of wavelength regions of the electromagnetic spectrum, for example, the visible region, infrared or ultraviolet region, when activated by applying a potential difference across it or passing an electrical current through it. For example, a light-emitting element can have monochromatic, quasi-monochromatic, polychromatic or broadband spectral emission characteristics. Examples of light-emitting elements include inorganic or organic solid-state light-emitting diodes, organic or polymer/polymeric light-emitting diodes, optically pumped phosphor coated light-emitting diodes, optically pumped nanocrystal light-emitting diodes or other similar devices as would be readily understood by a worker skilled in the art. Furthermore, the term light-emitting element is used to define the specific device that emits the radiation, for example a LED die or other device.

As used herein, the term "about" refers to a +/−10% variation from the nominal value. It is to be understood that such a variation is always included in any given value provided herein, whether or not it is specifically referred to.

Unless defined otherwise, all technical and scientific terms used herein have the same meaning as commonly understood in the art to which this invention belongs.

The present invention provides a lighting device package with one or more light-emitting elements operatively coupled to a substrate and a frame disposed at least in part around the one or more light-emitting elements. The frame and substrate define a cavity in which the one or more light-emitting elements are positioned, wherein this cavity can be substantially enclosed by an optically transmissive system. At least a portion of the cavity can be filled with an encapsulation material. The frame defines one or more passageways, wherein each passageway interconnects the cavity with the outside through an outside port. For example, the outside port can be accessible from the ambient when the lighting device package is in an assembled state, thereby providing a means for insertion of the encapsulation material into the cavity. The one or more light-emitting elements can be operatively attached to a power supply via, for example, bonds, ball grids or traces on the substrate for supplying power to the one or more light-emitting elements under operating conditions.

In one embodiment, the encapsulation material can be deposited in different ways during the assembly of the substrate, frame, and optically transmissive system to realize a lighting device package which has a cavity that is filled with a desired amount of encapsulation material. For example, one or more light-emitting elements can be deposited on the substrate, then the frame can be deposited on the substrate, wherein the frame can laterally substantially enclose the outer perimeter of the one or more light-emitting elements. Then a predetermined amount of encapsulation material in a desired modification, for example, in a liquid state, can be deposited on or adjacent to the one or more light-emitting elements, and subsequently an optically transmissive system can be deposited on the frame. The assembly can completely enclose the one or more light-emitting elements and the one or more light-emitting elements can be sealed between, for example, the encapsulation material and the substrate. During this fabrication sequence, if required, excess encapsulation material may enter the one or more passageways defined in the frame thereby enabling the provision of desired amount of encapsulation material within the cavity the cavity defined by the substrate and the frame.

In one embodiment, the one or more light-emitting elements can be disposed on the substrate, the frame defining two or more passageways, can subsequently be disposed on the substrate to substantially laterally surround the one or more light-emitting elements, and the optically transmissive system can be deposited on the frame resulting in an empty cavity adjacent to the one or more light-emitting elements. Subsequently, encapsulation material can be introduced from an outside port through one or more passageways in the frame in order to fill the cavity with a desired of encapsulation material, wherein a passageway defined by the frame can enable the escape of air or other gas which is contained within the substantially enclosed volume associated with the cavity, during the insertion of the encapsulation material therein.

In one embodiment, the light-device package can be thermally connected, for example by soldering or other thermally conductive connection technique as would be readily understood, to a heat sink or heat pipe.

FIG. 1 schematically illustrates a cross section of a lighting device package 100 according to one embodiment of the present invention. The lighting device package comprises substrate 110, lens 120, frame 130 and light-emitting elements 140. The light-emitting elements 140 are disposed in a cavity 160 defined by the substrate 110 and the frame 130, wherein the light-emitting elements are operatively coupled to die attach pads 150. The substrate 110 has traces 112 which provide electrical connections for the light-emitting elements 140. The frame comprises passageways 134 which between the cavity 160 and outside ports 136, wherein the passageways 134 fluidically connect the cavity 160 to the outside, wherein these passageways 134 can enable movement of an encapsulation material deposited within the cavity 160 during fabrication of the lighting device package.

Frame

The frame is operatively coupled to the substrate, wherein the frame together with the substrate define a cavity in which the one or more light-emitting elements are disposed. The frame further defines one or more passageways, which provide a fluidic connection between the cavity and an outside port which is located outside of the lighting device package.

In one embodiment of the present invention, the cavity is further defined as a substantially enclosed volume, defined by the substrate, frame and optically transmissive system, which together substantially encloses the one or more light-emitting elements disposed within the cavity. The one or more passageways defined in the frame can enable the insertion of encapsulation material into the cavity, thereby enabling the placement of a desired amount of encapsulation material within the cavity.

In one embodiment of the present invention, a desired amount of encapsulation material is placed within the cavity prior to the positioning of the optical transmissive system, wherein the one or more passageways defined by the frame enable the movement of encapsulation material therethrough during placement of the optically transmissive system, if required.

The one or more passageways can be configured in a number of ways, for example a passageway can be linear, curvilinear, or a segmented linear, or segmented curvilinear or other configuration as would be readily understood by a worker skilled in the art. In embodiment of the present invention, the cross sectional shape of a passageway can be circular, elliptical, square, rectangular or other shape as would be readily understood.

In one embodiment of the present invention, the one or more passageways can be configured to have a desired cross sectional shape which may be selected for ease of fabrication, fluid movement or other purpose as would be readily understood. For example, each of the one or more passageways can have the same cross sectional shape or independent cross sectional shape, wherein a cross sectional shape can include, circular, square, rectangular, elliptical, oval, octagonal or other shape as would be readily understood.

In one embodiment of the present invention, the cross sectional shape of a passageway can be uniform or vary along the length thereof. For example, a passageway can have a reduction in the cross sectional area thereof upon entry into the cavity defined by the frame and the substrate. In this configuration of the passageway, during insertion of the encapsulation material into the cavity through the passageway, the pressure associated with the encapsulation material can increase prior to entry into the cavity due to the cross sectional area restriction of the passageway.

In one embodiment of the present invention, the inside surface of the frame which faces the one or more light-emitting elements is predominantly intended to reflect light which is laterally emitted from the one or more light-emitting elements. For example, an adequately designed and reflective inside surface of the frame can contribute to efficient light extraction from the lighting device package.

In one embodiment, the inside surface of the frame faces the light-emitting elements and can be diffuse or specular reflective. For example, the inside surface of the frame can be white and characterised by mixed diffuse and specular reflective characteristics. White surfaces can be realized in various different ways, for example, the surface can be coated or painted. In one embodiment, a portion of the frame or the whole solid frame can be made of a white material, for example a white ceramic or white plastic, for example Amodel™ plastic or the like, in order to provide the desired optical characteristics on the inside surface of the frame. In one embodiment, the inside surface of the frame can be metallized, for example, to realize a mirror with a desired mix of specular or diffuse reflective characteristics.

In one embodiment, the inside surface or other surface of the frame can be coated or configured with a layer of specular reflective Al, Ag, or the like, for example. These format of metallic layers can be deposited using various methods including sputtering, ablation or evaporation, or the like for example.

In one embodiment, the frame can be injection moulded and coated with a layer of metal on the inside surface, for example. In one embodiment of the present invention, the material for the frame or the inside surface of the frame can configured to have an index of refraction which is lower than the index of refraction of the encapsulation material to be positioned within the cavity in order to encapsulate the one or more light-emitting elements. For example, if the inside surface of the frame is adequately shaped and the refractive indices are properly chosen, light from within the encapsulation material can be effectively total internal reflected at the inside surface and directed towards the optically transmissive system, thereby resulting in a desired level of light extraction from the lighting device package.

In one embodiment of the present invention, the angle of intersection between the inside surface of the frame and the substrate can be configured such that a desired light emission pattern is generated. For example, this angle of intersection can be between about 90 degrees and about 170 degrees, and in one embodiment the angle of intersection can be about 135 degrees.

The inside surface of the frame can be configured or shaped in one or more of a variety of configurations. For example the inside surface can be planar, segmented planar, curved, ellipsoid, paraboloid, polyhedral or other format of a shaped surface. In addition, the frame can have a cross sectional area which is a regular or irregular polygon, or an annular shape and can have an open or closed plan which is parallel to the cross section. In one embodiment of the present invention, the frame is configured to fully or partially circumscribe the one or more light-emitting elements.

In one embodiment of the present invention, the frame can be a separate component or the frame can be integrally shaped with one or more elements of the optically transmissive system. In one embodiment, a dual shot moulding process can be employed to fabricate an integrally shaped or integrally connected frame and lens.

In one embodiment of the present invention, the frame can be directly operatively disposed on the substrate by moulding it onto the substrate using the substrate as a part of the mould during the moulding process, for example as is done with insert moulding.

In one embodiment of the present invention, the frame comprises a support structure which can provide a location for the positioning and support of the optically transmissive system of the lighting device package. For example, the support structure can be configured as a recessed shoulder which can provide a support recess to a lens or other optically transmissive system. When the support structure is configured as a recess, the support structure can further enable mechanical restraint to the movement of the optically transmissive system relative to the frame.

In one embodiment of the present invention, the frame comprises two or more attachment devices which are configured to mechanically interconnected with mating attachment regions of the substrate. For example, the frame can comprises two or more pegs or feet which are used to mechanically position the frame relative to the substrate and or to enable mechanical connection therebetween. In one embodiment, the two or more attachment devices can be coupled to the substrate using adhesive, heat staking or frictional or press or interference fit connection.

Figure 2:
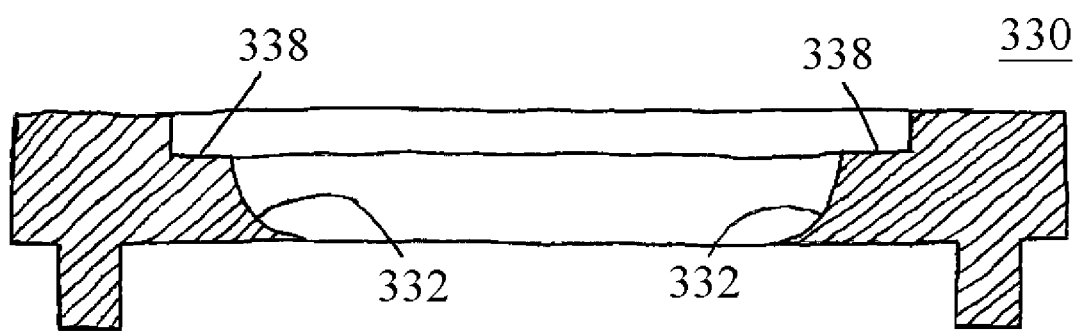
FIG. 2 schematically illustrates a cross section of a frame of a lighting device package, according to one embodiment of the present invention.

FIG. 2 illustrates a frame according to one embodiment of the present invention. The frame 330 and inside surface 332 has a section which has a concave curved perpendicular shape. The inside surface can be shaped to provide high directive reflectivity for light emitted by adjacent light-emitting elements and which impinges on it. Adequately shaped inside surfaces can aid in the generation of a desired light emission distribution. The frame 330 has a recess 338 for locating an optically transmissive system such as a lens, for example.

In one embodiment of the present invention, the frame is formed from a metal, for example aluminium or other metal or alloy as would be known to a worker skilled in the art. Many metals reflect visible light extremely well provided that surface corrosion, for example, oxidation occurs in a controlled manner. A metal frame can be coated to seal the surface from corrosion or oxidation. The control of surface oxidation can be important specifically for frames made of aluminium, for example. The use of metal frames may require the deposition of electrically insulating layers such as polyimide on top of the substrate, in order to electrically isolate electrically one or more electrically conductive layers associated with the substrate.

In one embodiment of the present invention, the lighting device package comprises a plastic frame that can be moulded directly on the substrate. For example, using an insert moulding process the substrate is first inserted into the mould which is subsequently filled with the desired moulding compound to fabricate the frame. The inside surfaces of the frame can be selectively coated with, for example, aluminium or silver using sputtering or suitable evaporation processes, for example. An electrically insulating layer can be disposed on the substrate prior to disposing any optically reflective and electrically conductive material that could short-circuit electronic components of the lighting device package. In one embodiment, the frame can be fabricated using a material with a refractive index suitable to cause total internal reflection in combination with encapsulation materials of adequate refractive index.

In one embodiment of the present invention, the frame is made of high temperature resistant materials. High temperatures can occur during operation of the one or more light-emitting elements associated with the lighting device package. In addition, high temperatures may arise during the assembly of the lighting device package, for example during soldering, epoxy curing or during thermosonic bonding processes. Examples of materials with high thermal resistance and durability include LCP plastic and Amodel™ plastics, and the like.

In one embodiment of the present invention, the frame is formed from a material such that it has a lower refractive index than the refractive index of the encapsulation material. In this embodiment, the frame may not require coatings, for example, reflective metallization on its inside surface. If adequately shaped the lower refractive index of the frame material will cause a high degree of total internal reflection at the inside surface of the frame for light coming from the encapsulation material. The relative amount of light which can be reflected to effectively enhance the light extraction from the lighting device package depends on the ratio of the refractive indices of the materials of the encapsulation material and the frame. A suitably shaped inside surface can provide a high degree of total internal reflection, wherein this total internal reflection of the light may be directed towards the lens.

Substrate

The substrate provides a structures upon which the one or more light-emitting elements can be operatively mounted. The substrate can be configured in a number of manners and can be formed in a number of ways, for example the substrate can be a printed circuit board (PCB) for a multilayer circuit board for example a metal core printed circuit board (MCPCB) or other substrate as would be readily understood by a worker skilled in the art.

In one embodiment, the substrate is highly thermally conductive. For example, the substrate can comprise one or more layers of AlN ceramic with metallization on the top and bottom, or the substrate can be a LTCC ceramic on Cu/Mo/Cu metal base PC board or configured in another manner which would provide a thermally conductive substrate as would be readily understood to a worker skilled in the art. In one embodiment, the substrate can also comprise a moulded plastic material such as LCP plastic or Amodel™ plastic, or the like for example.

In one embodiment of the present invention, the surface of the substrate facing the cavity, or predetermined areas of the substrate, can be diffuse or specular reflective. The reflective properties can result from metal, for example, aluminium or silver coatings, wherein this optical property of the substrate can aid in the redirection of light emitted by the one or more light-emitting elements towards the optically transmissive system.

In one embodiment of the present invention the substrate comprises one or more layers with traces or vias for operatively connecting the one or more light-emitting elements, die attach pads or other electrical devices. The layers or traces can comprise various materials such as metal alloys including any combination of copper, silver, gold, aluminium, tin, or the like for example.

Substrate layers which comprise electrically conductive components, for example light-emitting elements, that must not be short-circuited such as certain combinations of electrically conductive traces, for example, need to be electrically insulated from layers that are optically reflective but also electrically conductive. Therefore in one embodiment of the present invention, suitable electrically insulating materials as are well known in the art, can be used to suitably electrically isolate the conductive traces or layers for example. In one embodiment of the present invention, metal traces on the top surface of a substrate can be buried under or covered by a thin electrically insulating layer of dielectric material, for example 0.5 to 2 mil thick polyimide or other electrically insulating material as would be readily understood by a worker skilled in the art. In one embodiment, an electrically insulating layer can also be unselectively or selectively deposited on areas of the substrate which may be covered by the frame, in order to electrically isolate the frame which may be electrically conductive. The deposition of an electrically insulating layer may have a realized benefit, as it may enable the provision of a smoother more even interface for the connection between the substrate and the frame, for example.

In one embodiment of the present invention, the substrate is soldered to a PC board, a flex circuit or to wires connected to electrical drive circuitry. The substrate can have one or more electrically conductive layers comprising Au or Au/Sn or other solder alloy as would be readily understood by a worker skilled in the art. In one embodiment, the substrate is sufficiently large in order that a desired or required amount of electrical circuitry is disposed on the substrate.

In one embodiment of the present invention, the frame and the substrate are integrally formed, wherein the substrate comprises one or more indentations formed therein which can be used as reflective cavities. The indentations can be formed in the substrate using a variety of methods depending on the substrate material. For example, indentations in a co-fired ceramic substrate can be formed during the fabrication of the substrate. In order to reproducibly realize indentations in co-fired ceramic substrates care must be taken because preformed bodies of ceramic materials can significantly change their shape during co-firing.

In one embodiment, it can be beneficial for reproducibility of an indentation in the substrate to use forming tools during co-firing of a ceramic substrate. Forming tools can provide moulds having a predetermined shape which can be applied against a preformed ceramic body during co-firing to aid in the shaping of indentations. It is noted that the pressure at which forming tools can be applied must be carefully controlled throughout the co-firing process to avoid cracking or breakage of the ceramic body. The shape of the forming tool can help define the shape of the indentation, for example the inclination of the shoulder of the indentation. Forming tools can be made of certain compound materials which maintain sufficiently accurate shapes and extensions when exposed to high temperatures. Forming tools must not undesirably adhere to the ceramic material or permanently deposit or release any undesired material onto or into the surface of the ceramic material. A variety of methods and techniques for co-firing ceramic substrates are well known in the art.

In one embodiment, a ceramic substrate can be preformed into a predetermined shape having an indentation before co-firing taking into account the differential shrinkage and extension during co-firing. Consequently, the shape and extensions of preformed substrates can be different from the shape and extensions of the co-fired substrate.

Encapsulation Material

An encapsulation material fills at least a portion of the cavity defined by the frame, substrate, which can be further defined as a volume upon connection thereof to an optically transmissive system. The encapsulation material can surround the one or more light-emitting elements mounted on the substrate, wherein the encapsulation material may be selected to have an index of refraction greater than the index of refraction of the optically transmissive system.

For example, total internal reflection within the lighting device package can be reduced when the one or more light-emitting elements, for example LED dies, are in substantially direct contact with an optical component, for example, an encapsulation material. In one embodiment of the present invention, the encapsulation material can be selected to have an index of refraction closer to the light-emitting elements. Encapsulation material with refractive indices which are only slightly lower than the index of refraction of a light-emitting element can reduce the percentage of light rays subject to total internal reflection at the optical interface between the light-emitting element and the encapsulation material.

In one embodiment, the encapsulation material is made of, for example, soft or fluid materials which can aid in the control of thermally induced stress at or near optical interfaces due to differing thermal expansion coefficients and fluctuating thermal operating conditions.

In one embodiment of the present invention, soft or fluid encapsulation material or optical silicone can be sealed, for example, between an adjacent optically transmissive system, for example a lens and other elements such as the substrate. In addition, encapsulation material can be in direct thermal contact with one or more light-emitting elements.

Typical encapsulation materials include certain silicones and elastomers or clear gel with low ionic impurities such as Cl, K, Na, or the like for example. Other encapsulation materials with suitable refractive indices include PMMA, polycarbonate, nylon and silicone, for example, which absorb little visible light and typically only certain ultra violet (UV) light. Some of these types of materials can provide resistance to discoloration under prolonged exposure to UV light and a range of suitable indices of refraction. A number of encapsulation materials are well known in the art and available under brand names such as Dow Corning™, Nye™ or Nusil™, for example.

In one embodiment of the present invention, encapsulation materials which are suitable for embedding or encapsulating a light-emitting element can have refractive indices of about 1.55 or less.

Optically Transmissive System

The optically transmissive system essentially provides an optically transparent cover for the one or more light-emitting elements operatively coupled to the substrate, and together with the substrate and the frame defines volume to the cavity which substantially encloses the one or more light-emitting elements, wherein this cavity is partially or completely filled with an encapsulation material.

The optically transmissive system aids with the manipulation and extraction of electromagnetic radiation from the lighting device package, which is generated by the one or more light-emitting elements. In one embodiment of the present invention, the optically transmissive system is configured as a lens, for example a dome lens or other lens as would be readily understood by a worker skilled in the art.

The surface of the optically transmissive system which faces the one or more light-emitting elements can be curved or flat. In one embodiment of the present invention, this surface is convex in shape thereby reducing the likelihood of gas being trapped between this surface of the optically transmissive system and the encapsulation material.

In one embodiment of the present invention, the optically transmissive system comprises a combination of optical elements, wherein these optical elements may vary in size. For example sub-micrometer to millimeter or larger sized lenticular or other refractive optical elements can be integrated into the optically transmissive system.

The optically transmissive system can be made of clear PMMA, COC, BK7 glass, polycarbonate, nylon, silicone rubber or other material as would be readily understood by a worker skilled in the art. The optically transmissive system can optionally be configured as a coloured component while retaining the required level of optical transmissivity for the lighting device package.

In one embodiment of the present invention, materials having adequate index of refraction for the optically transmissive system and the encapsulation material are selected in order to realize efficient light extraction from the lighting device package. Appropriate selection of the refractive indices of these materials can reduce chances that light which propagates inside the lighting device package, for example through the encapsulation material and subsequently into the optically transmissive system undergoes total internal reflection. Total internal reflection can occur at optical interfaces when light travels from an optically transparent medium with a higher index of refraction and impinges on an interface to an optically transparent medium with a lower index of refraction.

In one embodiment of the present invention, the optically transmissive system can be integrally formed with the frame, for example the frame and the lens can be moulded together or in sequence in a multi-shot moulding process. For example, dual shot moulding can provide the ability to fabricate a lens out of a material with a different refractive index than that of the frame. Depending on the shape of the frame and the lens the moulding sequence can be different.

Figure 3:
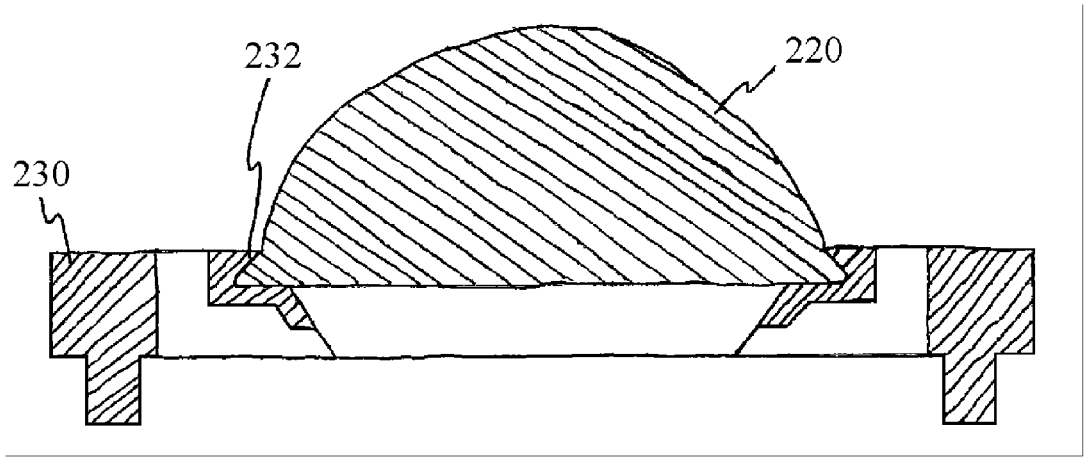
FIG. 3 schematically illustrates a cross section of an integrated frame and optically transmissive system for a lighting device package, according to one embodiment of the present invention.

Other process for integrally forming these components as would be readily understood by a worker skilled in the art. For example, FIG. 3 illustrates a frame and a lens for a lighting device package according to one embodiment of the present invention. The frame 230 and the lens 220 of the lighting device package have interlocking elements 232 that can durably interlock. It is noted that the materials of the frame and the lens should have adequately similar thermal expansion coefficients to help control mechanical stress which can be induced by thermal cycling. The lens and frame materials ideally should also have good adhesion in order to adequately environmentally seal the cavity and the encapsulation material from, for example, ambient moisture. Moreover, good adhesion between the lens and the encapsulation material and also between the frame and the encapsulation material is required to avoid delamination between these components. Delamination can introduce undesired voids and gaps at the optical interfaces between components of the lighting device package which can undesirably alter the reflectivity characteristics and consequently the efficiency of the light extraction from the lighting device package.

Light-Emitting Element Attachment

The one or more light-emitting elements, for example LED dies are operatively coupled to the substrate in order that the desired electrical current can be supplied to the one or more light-emitting elements. In one embodiment of the present invention, the substrate comprises one or more die attach pads wherein a light-emitting element is attached, for example soldered, to a die attach pad. A die attach pad can have die attach pad contacts with solder alloys, comprising gold, for example a gold tin, gold silver alloy or the like. The light-emitting element can have die contacts comprising, for example, gold, gold-tin or other alloys. In one embodiment, depending on the composition of the contacts of a light-emitting element and the composition of the die attach pad, solder alloys can be reflowed (liquefied) at elevated temperatures to attach a light-emitting element to the die attach pad. In one embodiment, a solder paste can be deposited on the die attach pad before disposing the light-emitting element. Solder paste can comprise, for example Au/Sn, which can be reflowed at elevated temperature to create a bond between the light-emitting element and the die attach pad.

In one embodiment of the present invention, an electrically and thermally conductive adhesive can be used to attach a light-emitting element to a die attach pad. Such adhesives can include Ag containing epoxy, or the like, for example. Depending on the kind of adhesive, solder alloy metal die attach pads may not be required on the substrate in order to establish a durable mechanical and electrical contact with the light-emitting element.

In one embodiment of the present invention, the die attach pads on the substrate can provide a highly optically reflective top surface and can be thermally connected to a common underlying metallization layer, wherein such metallization layers are widely used in certain ceramic substrates, as would be known to a worker skilled in the art.

In one embodiment, different contacts of the light-emitting elements can be separately connected to their own contact pad or trace which can be located on either a die attach pad or elsewhere on the substrate. Individual contacts on a die attach pad can be operatively connected to traces on the substrate.

The invention will now be described with reference to specific examples. It will be understood that the following example is intended to describe embodiments of the invention and are not intended to limit the invention in any way.

EXAMPLE

FIG. 1 schematically illustrates a cross section of a lighting device package 100 according to one embodiment of the present invention. The lighting device package comprises substrate 110, lens 120, frame 130, light-emitting elements 140 and die attach pads 150. A projected angle of intersection between the inside surface 132 of the frame and the surface of the substrate can be defined as a desired angle, for example 135 degrees. Generally, different angles can facilitate the generation of different light emission patterns, which in turn modifies the ability of the lighting device package to extract and redirect light out of the lighting device package. The substrate 110 has traces 112 which provide electrical connections. Optionally the substrate has a combination of electrically insulating coatings 114 and reflective coatings 116. The inside surface 132 can have a straight, a straight segmented or any simple or complex curved perpendicular cross section. Perpendicular indicates any direction that is at normal angle with the lateral surface of the substrate. Alternatively, the inside surface can have a polyhedral shape (not illustrated). The frame can have any regular or irregular polygonal or annular shaped, open or closed plan parallel cross section. The frame has passageways 134 between the cavity 160 and outside ports 136.

As illustrated in FIG. 1 the frame optionally can have two or more, for example cylindrical or conical, pegs 170 which can fit in respective holes in the substrate. The pegs and the holes can be used to laterally locate the frame on the substrate. The pegs can optionally be heat-staked into the holes to durably attach the frame to the substrate. Alternatively, the frame can be attached with a layer of adhesive.

The frame has a recessed shoulder 138 for locating a lens. If adequately shaped, the shoulder and lens can durably attach to each other. As illustrated the lighting device package provides two outside ports which can be used to inject an encapsulation material such as silicone gel, for example. One outside port can be used to inject encapsulation material while the other provides an escape route for spilling excess encapsulation material during injection. The spilling of excess encapsulation material can aid in controlling the flow of encapsulation material and the pressure inside the cavity.

Many encapsulation materials can be degassed to remove undesired inclusions, for example air, gas or vapour bubbles. The removal can be carried out at certain stages of the assembly process either prior to dispensing, as well as optionally after injection into the cavity. As is well known, combining depressurizing the ambient along with adequate thermal cycling can aid in removing bubbles and inclusions.

The lens can be attached to the frame by heat-staking the lens flange 122 and the frame. As is well known, energy can be deposited to heat the components in a well localized manner, for example in and adjacent the shoulder and the lens flanges.

It is obvious that the foregoing embodiments of the invention are examples and can be varied in many ways. Such present or future variations are not to be regarded as a departure from the spirit and scope of the invention, and all such modifications as would be obvious to one skilled in the art are intended to be included within the scope of the following claims.

We claim:

1. A lighting device package comprising:
   a) a substrate;
   b) a frame disposed on the substrate and having at least one passageway defined therein;
   c) one or more light-emitting elements operatively disposed within the cavity; and
   d) an optically transmissive system disposed on the frame and optically coupled to the one or more light-emitting elements;
   wherein the frame has an inside surface that extends from a bottom surface of the optically transmissive system to a top surface of the substrate, and wherein the inside surface of the frame together with the bottom surface of the optically transmissive system and the top surface of the substrate define a cavity,
   wherein the cavity is at least in part filled with a light transmissive encapsulation material,
   wherein the passageway defined in the frame extends through the frame from the cavity to an associated outside port provided on a surface of the frame facing away from the substrate, and
   wherein the passageway enables fluidic movement of the encapsulation material between the cavity and the associated outside port.

2. The lighting device package according to claim 1, wherein the inner surface is optically reflective.

3. The lighting device package according to claim 2, wherein the inner surface is coated with a specular reflective material.

4. The lighting device package according to claim 2, wherein the encapsulation material has a first index of refraction and the inner surface has a second index of refraction which is lower than the first index of refraction.

5. The lighting device package according to claim 2, wherein the inner surface has a surface shape selected from the group comprising; ellipsoid, paraboloid and polyhedral.

6. The lighting device package according to claim 1, wherein the frame comprises a support structure configured to support and mechanically retain the optically transmissive system in a desired location.

7. The lighting device package according to claim 1, wherein the frame and the optically transmissive system are integrally formed.

8. The lighting device package according to claim 7, wherein the frame is formed from a first material and the optically transmissive system is formed from a second material.

9. The lighting device package according to claim 1, wherein the frame comprises two or more attachment devices configured to mechanically interconnect with respective mating attachment regions associated with the substrate.

10. The lighting device package according to claim 1, wherein the frame is electrically isolated from the substrate.

11. The lighting device package according to claim 1, wherein the frame and the substrate are integrally formed.

12. The lighting device package according to claim 1, wherein the passageway is configured to have a shape selected from the group comprising: linear, curvilinear, segmented linear and segmented curvilinear.

13. The lighting device package according to claim 1, wherein the passageway has a cross section selected from the group comprising: circular, square, rectangular, elliptical, oval and octagonal.

14. The lighting device package according to claim 1, wherein the passageway has a cross section and a length, wherein the cross section varies along the length so as to have a narrower cross-section where the passageway interfaces with the cavity and a greater cross-section where the passageway interfaces with the outside port.

15. The lighting device package according to claim 1, wherein the frame defines a second passageway fluidically coupling the cavity to a second associated outside port, wherein one or more of the two passageways are configured to enable gas to escape from the cavity.

16. The lighting device package according to claim 1, wherein the inner surface of the frame forms an angle of about 135 degrees with the top surface of the substrate.

17. The lighting device package of claim 1, wherein the encapsulation material has a first index of refraction and the one or more light-emitting elements have a second index of refraction which is greater than the first index of refraction.

18. The lighting device package of claim 1, wherein the encapsulation material has a first index of refraction and the optically transmissive system has a second index of refraction which is not less than the first index of refraction.

19. The lighting device package of claim 1, wherein the inner surface has mixed diffuse and specular reflective characteristics.

20. A lighting device package comprising:
a) a substrate;
b) a frame disposed on the substrate and defining a cavity, the frame comprising one or more passageways defined therein, each of said one or more passageways fluidically coupling the cavity to an associated outside port;
c) one or more light-emitting elements operatively disposed within the cavity; and
d) an optically transmissive system disposed on the frame and optically coupled to the one or more light-emitting elements;
wherein the cavity is at least in part filled with a light transmissive encapsulation material and wherein said one or more passageways enable fluidic movement of the encapsulation material,
wherein the frame includes an inner surface facing the cavity, wherein the inner surface is optically reflective, and
wherein the inner surface has mixed diffuse and specular reflective characteristics.

* * * * *